United States Patent [19]

Enke

[11] Patent Number: 4,991,822
[45] Date of Patent: Feb. 12, 1991

[54] VALVE HAVING CERAMIC VALVE BODIES WITH LOW FRICTION COATINGS

[75] Inventor: Knut Enke, Johannesberg, Fed. Rep. of Germany

[73] Assignee: Leybold Aktiengesellschaft, Hanau I, Fed. Rep. of Germany

[21] Appl. No.: 271,176

[22] Filed: Nov. 14, 1988

[30] Foreign Application Priority Data

Sep. 27, 1988 [DE] Fed. Rep. of Germany ....... 3832692

[51] Int. Cl.⁵ .................................................. F16L 5/00
[52] U.S. Cl. ................................. 251/368; 137/625.41
[58] Field of Search .................... 251/368; 137/625.17, 137/625.41

[56] References Cited

U.S. PATENT DOCUMENTS

| | | | |
|---|---|---|---|
| 3,124,054 | 3/1964 | Dore | 251/368 |
| 3,533,436 | 10/1970 | Parkison | 137/359 |
| 3,603,965 | 8/1972 | McClure et al. | 251/368 |
| 3,810,602 | 5/1974 | Parkinson | 251/304 |
| 3,834,416 | 9/1974 | Parkinson | 137/550 |
| 3,857,682 | 12/1974 | White | 29/195 |
| 4,685,487 | 8/1987 | Derdack et al. | |
| 4,856,758 | 8/1989 | Knapp | 137/625.41 |
| 4,862,907 | 9/1989 | Ledtje et al. | 137/512 |

FOREIGN PATENT DOCUMENTS

| | | |
|---|---|---|
| 0087836 | 9/1983 | European Pat. Off. . |
| 3624467 | 1/1988 | Fed. Rep. of Germany . |
| WO89/04433 | 5/1989 | PCT Int'l Appl. . |

Primary Examiner—A. Michael Chambers
Attorney, Agent, or Firm—Felfe & Lynch

[57] ABSTRACT

In a valve, especially for a shut-off or regulating means, having of a plate-like valve body of a metal or nonmetallic material having at least one layer of hard substance applied to the valve body, the coating consists of an alloy of silicon and/or carbon, preferably of $Si_xC_{1-x}$ (wherein -x has a value of 0 to 1), and is applied to the valve body by the method of plasma CVD or plasma polymerization, monomers (gases or gas mixtures which contain the atoms which are to form the hard coating) are used, which contain carbon or carbon and silicon.

6 Claims, 1 Drawing Sheet

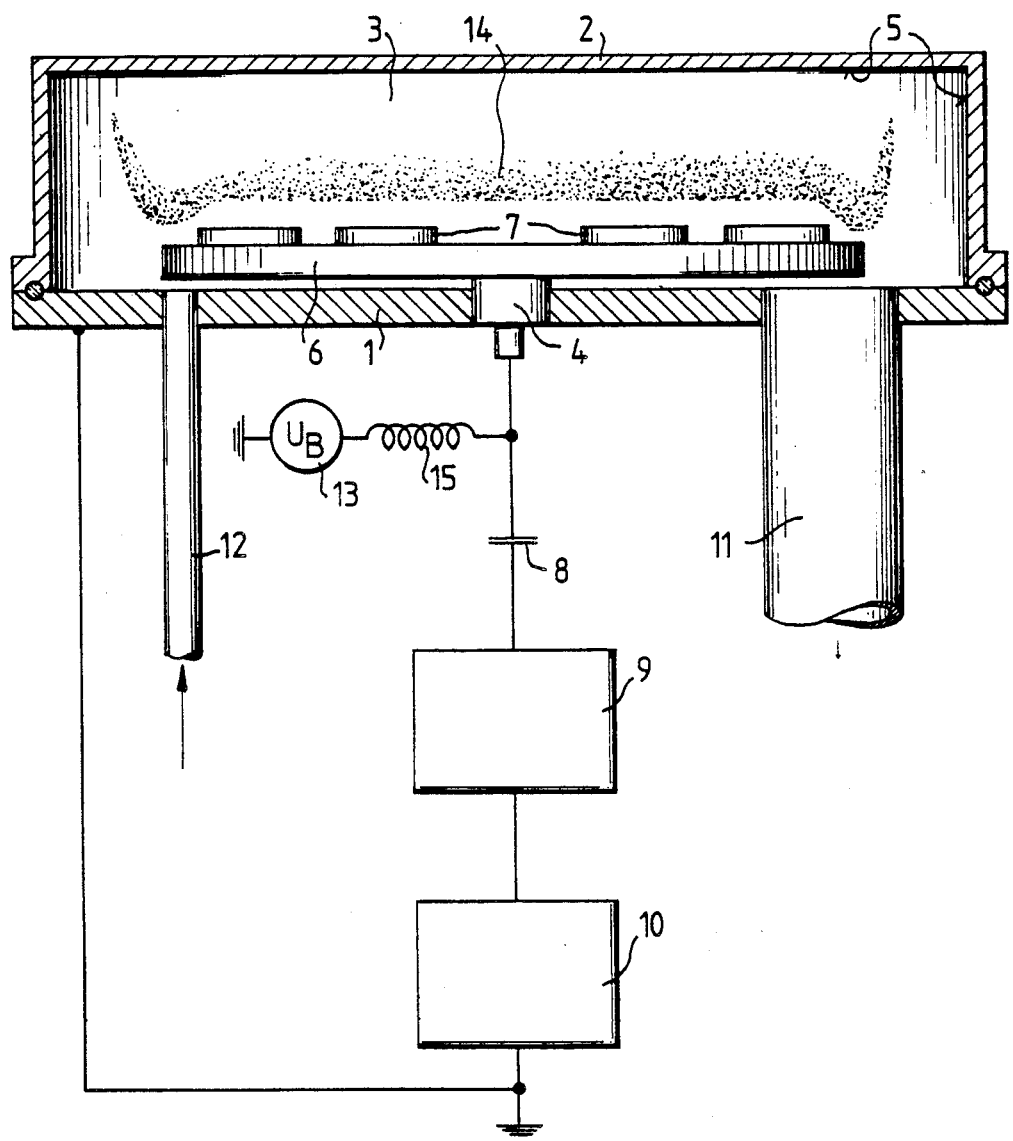

VALVE HAVING CERAMIC VALVE BODIES WITH LOW FRICTION COATINGS

BACKGROUND OF THE INVENTION

The invention relates to a valve, especially for shut-off and regulating means, having a flat, piston-like or spherical valve body made of a metal or nonmetallic material with at least one hard coating applied to the valve body, and a method for applying hard coatings to the valve body.

In high-quality faucets (e.g., single-lever mixing faucets), polished ceramic disks sliding one on the other are used as valve bodies for shutting off and controlling liquids and the like. To minimize wear on these disks or valve bodies and the friction involved in operating the faucets, one of the manufacturing steps consists in lubricating them superficially with installation grease. This grease is consumed in a few weeks by the flow of the liquid and the shifting of the ceramic disks by the operation of the faucet, so that ultimately all that is left as lubricant is the liquid being controlled by the disks. This as a rule is insufficient. In the ungreased state the static friction coefficient is often so high that, in addition to a general stiffness of operation (high static friction coefficient), the disks have been observed to stick. Then, if force is applied, the wear on the disks increases drastically and the faucet becomes unusable (U.S. Pat. Nos. 3,533,436; 4,685,487; 3,834,416). It is known that hard, amorphous, hydrogenous carbon coatings (a-C:H) in pure form or with admixtures of other elements have low dynamic friction coefficients. In general, nothing is said EP No. 0 087 836, to which U.S. Pat. No. 4,525,417 correspondent about the static friction coefficient. Furthermore, the deposit of siliceous and carbonaceous coatings of organic silicon compounds by means of a plasma has been disclosed in U.S. Pat. No. 3,822,928, European Pat. No. 0 150 878, and French Pat. No. 0.230.188.

SUMMARY OF THE INVENTION

The present invention relates to a valve having a metallic or nonmetallic valve body which is provided on its sealing surface with a hard, carbonaceous coating tightly adhering thereto. This hard coating can contain, in addition to carbon, hydrogen amounting to about 1 to 50 atomic percent of the substance. Without other additives, however, this amorphous, hydrogenous carbon (a-C:H) adheres but very poorly to many materials. These include some metals, and above all aluminum oxide ceramic. It has now been found quite surprisingly that even small admixtures (a few percent) of silicon in the carbon coatings suffice to improve substantially the adherence of these coatings. The hardness and frictional properties of the coatings are not adversely affected. The possibility exists of producing the entire friction-reducing and wear-reducing coating from carbon with a silicon admixture, or else of first applying a thinner, well-adhering ground or primary coating of carbon with silicon, and of applying to the primary coating a thicker, silicon-free carbon coating, or else a carbon coating with a different silicon content than the adherent coating.

It has been found that ceramic disks coated in this manner have low friction in sliding on one another in air, i.e., when dry, and also in the presence of water; no sticking is observed, i.e., the static friction coefficient is also low. Friction coefficients that heretofore have been achieved only by lubricating the surfaces in contact are achieved and bettered.

Plasma-activated chemical vapor deposition (PACVD, PCVD) is proposed in accordance with the invention as a process outstandingly suited for these purposes, and the parts to be coated do not have to be additionally heated. But if conventional (high-temperature) CVD is combined with PCVD, this signifies no restriction of the deposition principle. In this case the parts to be coated are heated to temperatures of several hundred degrees Celsius. By this process, also known as pyrolysis, carbon can be deposited in a hydrocarbon atmosphere, for example; this carbon, however, has graphite-like properties, so it is relatively soft, opaque and electrically conductive. Only an additional (or exclusive) ion bombardment, e.g., by a plasma or an additional ion gun, will permit hard, electrically insulating carbon coatings to form, having diamond-like properties. If heating is combined with a plasma, this is called plasma-enhanced (or plasma-energized) CVD (plasma-enhanced CVD, PECVD). This heating, however, is not necessary, and therefore plastics sensitive to high temperatures can also be coated by the PCVD method.

BRIEF DESCRIPTION OF THE DRAWINGS

The sole figure is an elevational section of a plasma producing diode system for coating workpieces.

DETAILED DESCRIPTION OF THE PREFERRED EMBODIMENT

On account of the necessary ion bombardment, an apparatus is especially suitable in which the workpieces 7 that are to be coated lie on the smaller electrode 6 of a plasma-producing diode system. The apparatus consists of an electrically conductive base plate 1, a likewise electrically conductive cover 2, a lead-through 4 mounted on and electrically insulated from the base plate, and rotatable if desired, which produces the electrical connection between the smaller electrode (cathode) 6 serving as workpiece holder, and the electrical power supply unit consisting of the radio frequency generator 10, the impedance transformer 9 and the coupling condenser 8. The large tube 11 provides the connection between the coating chamber 3 and a pump stand, not shown, which is capable, when the gas supply (connected by the thin tube 12 to the base plate) is shut off, of producing a vacuum amounting, after a couple of minutes, to a pressure of $10^{-8}$ to $10^{-3}$ mbar, preferably $10^{-6}$ to $10^{-4}$ mbar. This pressure range does not constitute any substantial restriction of the method since at low pump efficiencies, which correspond to higher residual gas pressures, the oxygen from the residual gas is in part incorporated into the coatings on account of its high affinity for silicon. This can be tolerated up to a certain degree. Ultimately, however, the organic silicon necessary for forming the coating becomes further oxidized to such an extent that the coatings can no longer be called silicon-carbon but are quartz, i.e., silicon dioxide.

The apparatus represented in the drawing for coating by the PCVD process relates to an especially simple application. However, plasma-generating apparatus can also be used, in which the vacuum chamber is made of electrically insulating material, e.g., quartz, and the electrical field necessary for producing a plasma is put in through coils or external or internal electrodes or through a microwave cavity resonator. Truly hard, carbonaceous coatings are obtained only if the articles to be coated are placed on a holder of negative polarity relative to the plasma 14. This can be done by applying a direct current to the workpiece holder or, advantageously, through the radio-frequency system consisting of the elements 8, 9 and 10. In the latter case the smaller electrode 6, which is the workpiece holder, charges negatively in the average time based on different mobilities of electrons and ions originating in the plasma, if the connection between the radio frequency generator 10 and workpiece holder 6 is isolated from direct current by a condenser 8. The cathode DC voltage UB is usually measured between condenser 8 and workpiece holder 6 and the ground by means of a DC meter 13. To prevent the radio frequency necessary for the process from bleeding off through the meter a radio-frequency choke 15 precedes the meter. The use of radio frequency for producing electrically insulating carbonaceous coatings having thicknesses of more than about 0.5 microns is essential, because if direct current is used insulating coatings above a critical thickness interrupt the flow of electrons and ions and thus shut down the coating process.

For the production of a plasma, not only the electrical energy put into the coating chamber 3 through the workpiece holder 6 is needed, but also a gas inside of this chamber at a pressure in the range of $10^{-4}$ to several millibars. This pressure range is associated with the independent plasma in which the gas is partially chemically excited, ionized and, in the case of multi-atomic gases, dissociated and broken up into radicals. The remainder of the atoms or molecules remains neutral. In the case of noble gases, the illustrated apparatus is a cathode sputtering system in which the workpiece holder 6 and the substrates 7 lying thereon are physically etched by ion bombardment. This represents an important step, though one that is not essential, in the cleaning of the workpiece before the actual coating step. If gases containing halogen, such as $CF_4$, $SF_6$, $C_2Cl_2F_2$ or $BCl_3$, are used instead of noble gases, a plasma-chemical etching takes place, of the kind that has long been used in the semiconductor industry for the production of extremely fine structures.

If the working gas furthermore also contains hydrogen, either molecular or as an admixture, then, under appropriate conditions determined mainly by the electrical power put into the coating chamber and the pressure of the working gas, solid coatings are deposited which cover all the objects in the chamber, including the chamber walls 5. The surface of the workpiece holder is in a special position in that it is constantly exposed during the coating process to an ion bombardment which can be controlled by the electrical power, and by which the coatings substantially receive their great hardness. The chamber walls are likewise exposed to ion bombardment, which, due to their greater area in comparison to the workpiece holder, is substantially less intense. As a result, polymer-like, usually softer and not as well-adherent coatings are deposited on the chamber walls and are of no importance for the invention.

Process gases especially suitable for the coating of ceramic have been found to be gases or mixtures of gases which contain silicon and carbon, and hydrogen (in contrast to halogens) in such a great amount that coating predominates over plasma-chemical etching. A mixture of $SiCl_4$ and $CF_4$, for example, can be expected to produce etching within a wide range of electrical power and gas pressure, while replacing $SiCl_4$ with $SiH_{14}$ in this gas mixture will result in a silicon carbide-like hard coating. The hydrogen binds to the fluorine to form hydrogen fluoride gas which is removed from the chamber by the pumping of the apparatus shown in the drawing. What remains is a solid SiC coating.

Advantageously, it is not necessary, however, to use silane $SiH_4$ which spontaneously ignites in air or the etchant gas $CF_4$, for use can be made of the large group of the organic silicon compounds. These are liquids whose vapor pressure, in the case of many of them, is so high even at room temperature that they can be aspirated through the tube 12 into the coating chamber merely by the vacuum in the latter.

The gases can be, for example, tetramethylsilane, hexamethyldisilane, hexamethydisiloxane, hexamethyldisilazane, vinyldimethylethoxysilane, tetraethoxysilane or any other siloxanes, silazanes or silanes containing methyl, vinyl, phenyl or alkoxy groups, but also their halogenated equivalents, such as dichloromethylsilane or trifluorosilane, for example. This selection does not entail any limitation. It is necessary only to assure that the process gas or mixture contains silicon and carbon and a concentration ratio of hydrogen to halogen such that it is not plasma-chemical etching that occurs but the depositing of a solid coating. In this connection the molecular structure of the process gases is irrelevant to the invention. Thus, they can be linear, branched or cyclic molecules. When they strike the cathode and the articles to be coated therein the molecules lose entirely their original structure.

EXAMPLE 1:

The depositing chamber is evacuated down to a pressure of $10^{-5}$ mbar. Then argon is introduced and the gas pressure is adjusted to 6 microbars through a proportioning valve. After the radio frequency generator was turned on a plasma was ignited. By varying the generator power a DC cathode voltage of 800 volts was established. Ten minutes later the argon valve was closed and at the same time the tetramethylsilane (TMS) valve was opened to such an extent that a gas pressure of 50 microbars developed in the chamber. The generator power was adjusted so that the cathode voltage was 600 volts. After half an hour the generator was shut off and the TMS valve closed. The depositing chamber was opened and the ceramic disks were removed. A shiny, dark gray hard coating was deposited on their sealing surfaces.

EXAMPLE 2:

Process steps as in Example 1, but with the following changes in the process parameters:

The coating gas hexamethyldisiloxane (HMDSO) was introduced, and the cathode voltage was 800 volts.

After half an hour a shiny, dark brown coating 2 microns thick was deposited.

EXAMPLE 3:

Process steps as in Example 1, but with the following changes in the process parameters:

Hexamethyldisilazane (HMDSN) gas was used, and the cathode voltage was 700 volts.

In half an hour a shiny, dark brown coating 2.5 microns thick was deposited.

EXAMPLE 4:

Process steps as in Example 1, but with the following changes in the process parameters:

Hexamethyldisilane (HMDS) gas was used. The gas pressure was adjusted to 30 microbars, the cathode voltage to 600 volts.

In half an hour a shiny, dark brown coating 1.6 microns thick was deposited.

EXAMPLE 5:

Process steps as in Example 1, but with the following changes in the process parameters:

A mixture of 10% TMS and 90% hexane was used, the gas pressure was adjusted to 70 microbars, the cathode voltage to 400 volts.

In half an hour a shiny black coating 3 microns thick was deposited.

EXAMPLE 6:

Process steps as in Example 1, but with the following changes in the process parameters:

A mixture of 40% HMDSN and 60% hexane was introduced, the pressure was adjusted to 50 microbars and the cathode voltage to 500 volts.

In half an hour a shiny, dark brown coating 1.5 microns thick was deposited.

EXAMPLE 7:

Process steps as in Example 1, but with the following changes in the process parameters:

TMS was introduced, at a pressure of 40 microbars, and the cathode voltage was adjusted to 900 volts. In 5 minutes the hexane valve was opened and simultaneously the TMS valve was closed, and the hexane pressure was adjusted to 30 microbars and the cathode voltage to 450 volts.

In half an hour a tightly adherent, glossy black coating was deposited.

EXAMPLE 8:

Process steps as in Example 1, but with the following changes in the process parameters:

HMDSO was used, and the gas pressure was adjusted to 35 microbars and the cathode voltage to 500 volts. After 10 minutes the hexane valve was opened and simultaneously the HMDSO valve was closed, and the hexane pressure was adjusted to 60 microbars and the cathode voltage to 600 volts.

Half an hour later a glossy black coating had been deposited.

EXAMPLE 9:

Process steps as in Example 1, but with the following changes in the process parameters:

A mixture of 5% HMDS and 95% hexane was used. The pressure was set at 30 microbars, the cathode voltage at 800 volts. After 5 minutes the HMDS valve was closed and the setting of the hexane valve was changed so that a gas pressure of 50 microbars was established. The cathode voltage was left unchanged.

Half an hour latter a glossy black coating had been deposited.

We claim:

1. A valve, especially for shut-off and regulating means, comprising a pair of ceramic valve bodies having respective sealing surfaces which slide against each other, each valve body being coated with a hard carbonaceous coating comprising a first layer containing carbon with a silicon admixture.

2. A valve as in claim 1 wherein said coating comprises an additional layer of different silicon content.

3. A valve as in claim 2 wherein said additional layer is a silicon-free carbon coating.

4. A valve as in claim 1 wherein said coating is an amorphous coating containing hydrogen.

5. A valve as in claim 1 wherein said coating contains oxygen.

6. A valve as in claim 1 wherein at least one of said ceramic valve bodies is aluminum oxide.

* * * * *

UNITED STATES PATENT AND TRADEMARK OFFICE
CERTIFICATE OF CORRECTION

PATENT NO. : 4,991,822

DATED : February 12, 1991

INVENTOR(S) : Knut Enke

It is certified that error appears in the above-identified patent and that said Letters Patent is hereby corrected as shown below:

Column 6, line 35 (Claim 3) delete "a" and "carbon coating".

Signed and Sealed this

Fifteenth Day of June, 1993

Attest:

MICHAEL K. KIRK

*Attesting Officer*  *Acting Commissioner of Patents and Trademarks*